(12) United States Patent
Ito

(10) Patent No.: US 7,906,367 B2
(45) Date of Patent: Mar. 15, 2011

(54) METHOD OF FORMING FINE PARTICLE PATTERN, AND METHOD OF PRODUCING A DEVICE

(75) Inventor: Toshiki Ito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 1052 days.

(21) Appl. No.: 11/710,939

(22) Filed: Feb. 27, 2007

(65) Prior Publication Data

US 2007/0212806 A1    Sep. 13, 2007

(30) Foreign Application Priority Data

Mar. 9, 2006 (JP) ................................ 2006-064666

(51) Int. Cl.
  *H01L 51/40*  (2006.01)
(52) U.S. Cl. .............................. 438/99; 257/E51.027
(58) Field of Classification Search .................. 438/99, 438/E51.027
  See application file for complete search history.

(56) References Cited

U.S. PATENT DOCUMENTS

| | | | |
|---|---|---|---|
| 6,755,953 B2 | 6/2004 | Baba .............................. 205/74 |
| 7,079,250 B2 | 7/2006 | Mukai ........................... 356/445 |
| 7,204,915 B2 | 4/2007 | Kitade et al. ................ 204/192.2 |
| 7,220,482 B2 | 5/2007 | Mino et al. .................... 428/403 |
| 2004/0001947 A1* | 1/2004 | Kawamura et al. ........... 428/327 |
| 2004/0038506 A1* | 2/2004 | Kataoka et al. ............... 438/584 |
| 2004/0067434 A1* | 4/2004 | Kano et al. ................. 430/270.1 |
| 2004/0209203 A1* | 10/2004 | Kano et al. .................... 430/324 |
| 2005/0064108 A1* | 3/2005 | Kano et al. .................... 427/553 |
| 2005/0176863 A1* | 8/2005 | Yokota et al. ................. 524/403 |
| 2005/0208428 A1* | 9/2005 | Kawamura et al. ........... 430/311 |
| 2005/0214693 A1* | 9/2005 | Kano et al. .................... 430/322 |
| 2005/0276912 A1* | 12/2005 | Yamamoto et al. ........... 427/117 |
| 2007/0003463 A1* | 1/2007 | Ajiri ............................. 423/274 |
| 2007/0212883 A1* | 9/2007 | Kano et al. .................... 438/694 |
| 2007/0218373 A1 | 9/2007 | Ito et al. ............................. 430/5 |
| 2007/0218398 A1 | 9/2007 | Ito et al. ......................... 430/141 |
| 2008/0014581 A1* | 1/2008 | Nakahara et al. .................. 435/6 |

FOREIGN PATENT DOCUMENTS

| | | |
|---|---|---|
| JP | 2000-356587 | 12/2000 |
| JP | 2001-168317 | 6/2001 |
| JP | 2002-80481 | 3/2002 |
| JP | 2003-168606 | 6/2003 |
| JP | 2003-268592 | 9/2003 |
| JP | 2003-321479 | 11/2003 |
| JP | 2005-190624 | 7/2005 |

OTHER PUBLICATIONS

Aurèlien Blanc, et al., "Wavelength-Controlled Orthogonal Photolysis of Protecting Groups", J. Org. Chem. vol. 67, 2002, pp. 5567-5577. (with Supplementary material, pp. S1-S77).

Grant A. Krafft, et al., "Photoactivable Fluorophores. 3. Synthesis and Photoactivation of Fluorogenic Difunctionalized Fluoresceins", et al., J. Am. Chem. Soc., vol. 110, 1988, pp. 301-303.

Alan R. Katritzky, "Model Compounds of Caged Capsaicin: Design, Synthesis, and Photoreactivity", J. Org. Chem., vol. 68, 2003, pp. 9100-9104.

* cited by examiner

*Primary Examiner* — Kiesha R Bryant
*Assistant Examiner* — Igwe U Anya
(74) *Attorney, Agent, or Firm* — Fitzpatrick, Cella, Harper & Scinto

(57) ABSTRACT

A method of forming a fine particle pattern, includes: forming a layer containing a silane coupling agent having a thiol group, an amino group, a hydroxyl group, a carboxyl group, or a sulfo group, each of which is protected by a photolytic protective group on a top-most surface of a substrate; exposing the substrate to light in a pattern; immersing the substrate into a colloidal solution in which metal atom-containing fine particles are dispersed; and allowing the metal atom-containing fine particles to selectively adhere onto an exposed area.

18 Claims, 7 Drawing Sheets

FIG. 1A
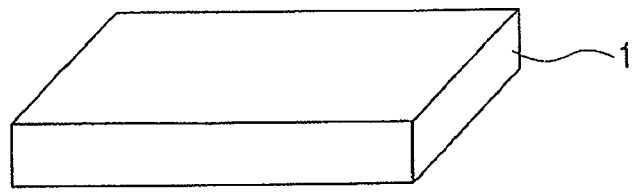
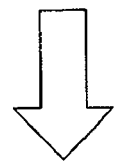
FORMATION OF A SILANE COUPLING AGENT LAYER
FIG. 1B
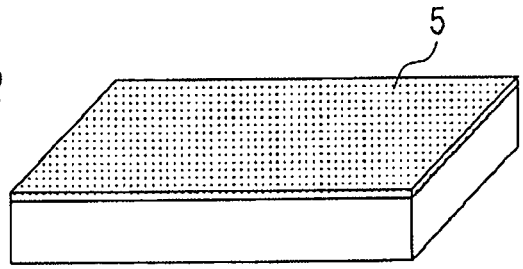
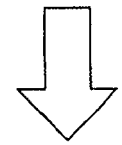
EXPOSURE TO LIGHT IN A PATTERN
FIG. 1C
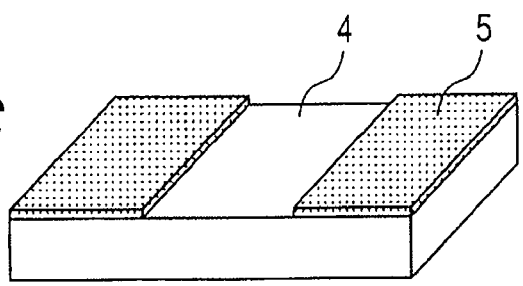
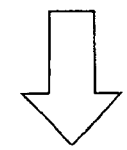
IMMERSION INTO A COLLOIDAL SOLUTION
FIG. 1D
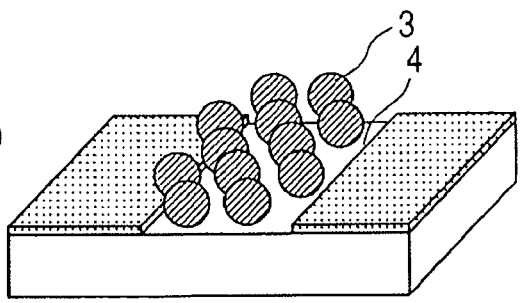

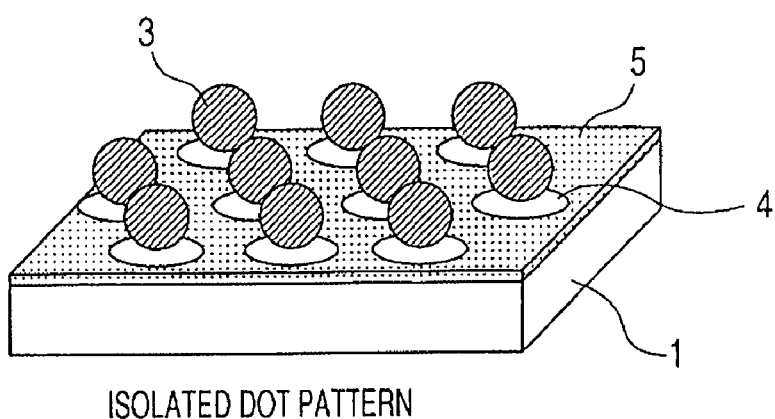
FIG. 4A  ISOLATED DOT PATTERN
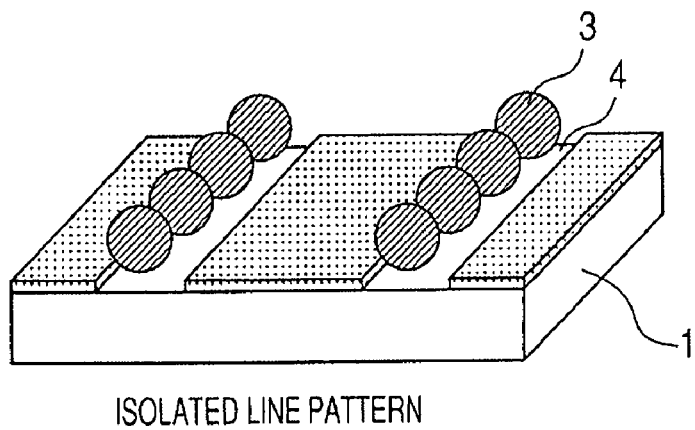
FIG. 4B  ISOLATED LINE PATTERN
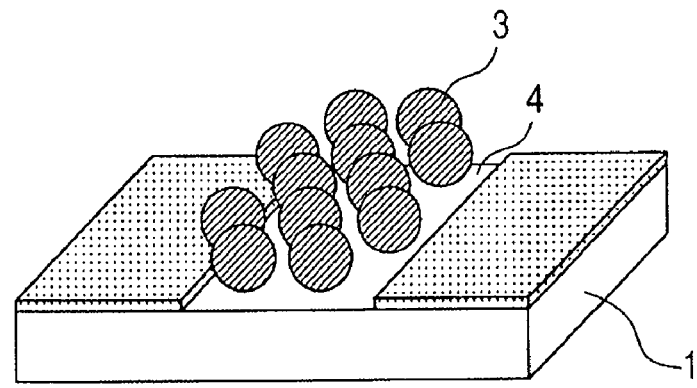
FIG. 4C  CLOSEST PACKED PATTERN
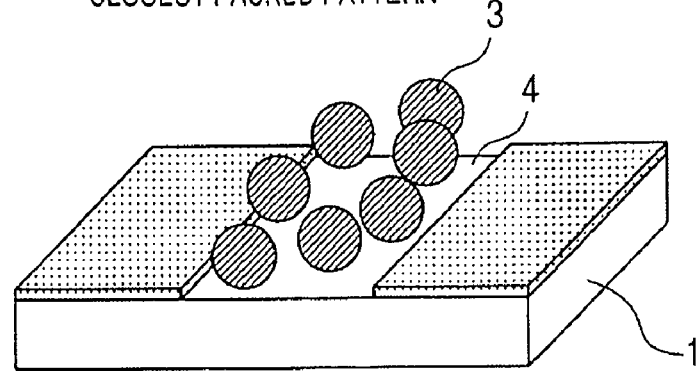
FIG. 4D  RANDOM PATTERN

METHOD OF FORMING FINE PARTICLE PATTERN, AND METHOD OF PRODUCING A DEVICE

BACKGROUND OF THE INVENTION

1. Field of the Invention

The present invention relates to a method of forming a fine particle pattern, and a method of producing a device, which includes a step of forming a fine particle pattern by using the method of forming a fine particle pattern.

2. Description of the Related Art

Higher-level integration of semiconductor devices largely contributes to development of computer technology supporting the advanced information society showing a significant progress in recent years. It is estimated that the higher-level integration would be increasingly requested in future. However, there arise a number of problems involved in the higher-level integration, such as narrow channel effects and short channel effects involved in reduction of gate lengths and gate widths, and an increase in gate leak current associated with thinning of gate oxide films.

While investigations have been conducted to solve the above-mentioned problems, researches on a single-electron device eliminating the above-mentioned problems are being conducted.

The single-electron device is a device which is composed of arrayed quantum dots, and controls one electron or few electrons by utilizing a "Coulomb blockade" phenomenon in which tunneling of an electron is suppressed by Coulomb energy.

By using the single-electron device, all of the above-mentioned problems of the current semiconductor devices would be solved, and electric power consumption is expected to be about several ten-thousandths of that required conventionally.

The single-electron device has such a characteristic that a temperature at which the device can operate increases as the size thereof reduces. Therefore, to allow the device to operate at room temperature, an electrostatic capacity thereof has to be about 10 to 18 F.

A dot size and an interval between the dots, which are estimated from the electrostatic capacity, are several nanometers and about 1 nm, respectively.

As a method of forming a pattern of dots of this size, an electron beam lithography or a self-organization of metal fine particles is used (Japanese Patent Application Laid-Open No. 2001-168317).

As well as the higher-level integration of the semiconductor devices, higher recording density of a magnetic recording medium realized by hard disk drives (HDD) largely contributes to the development of the computer technology.

The higher recording density involves a problem of information deletion due to heat fluctuation. To prevent the information deletion, the magnetic recording system is shifting from a longitudinal magnetic recording type to a perpendicular magnetic recording type. In addition, in recent years, there are proposed patterned media.

As a method of producing a recording bit in the patterned media, there is adopted, for example, a method which involves forming a resist pattern corresponding to a desired pattern by the electron-beam lithography, and transferring the resist pattern onto a ferromagnetic layer by dry etching (for example, Japanese Patent Application Laid-Open No. 2005-190624).

In recent years, technologies, which require micro-fabrication in nano-scale order are proposed other than the electron device. For example, there is proposed a chemical sensor to be used for detection and identification of a substance or for an examination of a molecular structure, which utilizes localized plasmon resonance, which occurs near a metal fine particle irradiated with light (Japanese Patent Application Laid-Open No. 2000-356587).

The chemical sensor uses as a sensor chip a device having a structure in which metal fine particles are immobilized in layer on a surface of a dielectric material. The device includes: a unit for applying light to the layer of the metal fine-particles of the sensor chip; and a unit for measuring intensities of wavelengths, which are separated from the light reflected on the layer of the metal fine particles.

It is known that, when the metal fine particles have a uniform particle size and are arranged in a pattern, measurement results can stably be obtained (Japanese Patent Application Laid-Open No. 2003-268592). Formation of the pattern of the metal fine particles or the dot array pattern has conventionally been performed by one of various micro-fabrication techniques or by a combination of at least two of those techniques.

Specifically, examples of the techniques include: lithography and etching using one of ultraviolet light and an electron beam; self-organization arrangement of metal fine particles; arrangement of fine particles by using a probe of a scanning prove microscope such as AFM/STM; and microphase separation of a block copolymer.

Japanese Patent Application Laid-Open No. 2003-168606 discloses a prior art of a method of forming metal fine particles on a surface of a substrate into a pattern by using a combination of the lithography using ultraviolet light or an electron beam and the self-organization arrangement method of metal fine particles.

The formation of the pattern of the metal fine particles described above is performed such that: an organic coating film formed on a substrate is irradiated with an energy beam in a pattern to form a chemically reactive group on the organic coating film; and chemical bonds are generated between the chemically reactive group and an organic coating film on each of the surfaces of fine particles.

Photolithographic techniques using reduced projection exposure of ArF, KrF, or the like to ultraviolet light are used in production of the semiconductor devices. However, the photolithographic techniques have limits of resolution due to the diffraction limit of light, so it is difficult to form a dot pattern having dots in a high density of several tens nanometers.

In addition, the lithography using an electron beam is excellent in resolution, but throughput thereof is small, so the lithography using an electron beam is unsuitable for a large-scale production unit. Further, there is a problem in that an exposure apparatus therefor is expensive.

A resist pattern formed by lithography is transferred onto a metal layer by dry etching using reactive plasma, resulting in problems in transfer accuracy due to re-deposition of an etching product on a substrate to be treated or an etching mask, and occurrence of side etching.

In addition, a multilayer resist method or the like is used for retaining an aspect ratio sufficient for the etching of a metal. In this case, however, there are problems of complication of steps of the method and an increase in cost.

The self-organization method enables formation of a fine pattern to be kept for a short period of time, but has many defects, so there arises problems such as a long-term order in few-inch scale required in a magnetic recording medium or the like, and the reproducibility of the pattern. Further, there are such problems that a desired pattern cannot be formed, and the like.

Japanese Patent Application Laid-Open No. 2003-168606 described above represents results of implementation in which: a chlorosilane compound having an unsaturated alkyl group is formed into a monomolecular film on a glass substrate; the monomolecular film is irradiated with X ray into a pattern so that unsaturated bonds in an irradiated area are excited, to thereby allow the unsaturated group to bind to a monomolecular film on each of surfaces of fine particles. However, the technique disclosed in Japanese Patent Application Laid-Open No. 2003-168606 has such a problem that the fine particles do not sufficiently adhere onto the area irradiated with an energy beam, resulting in many defects. This is because the excited state of the groups, which are bound to each other via the unsaturated bonds is unstable so that the excited state easily returns to a ground state, thereby the groups are deactivated.

As described above, the conventional micro-fabrication techniques have many problems, so it is problematic to apply the conventional techniques to the production of various devices, which require high density dot patterns, which have been newly proposed in recent years. Specific examples of the devices include a single-electron device, a magnetic recording medium, a chemical sensor, a quantum dot laser device, and a photonic crystal optical device.

SUMMARY OF THE INVENTION

According to the present invention, there is provided a method of forming a fine particle pattern having a structure wherein a plurality metal atom-containing fine particles (A) are arranged on a substrate, comprising the steps of:

laminating an organic material layer on a substrate, the organic material layer being formed of an organic material having any one of a thiol group, an amino group, a hydroxyl group, a carboxyl group, and a sulfo group, each of which is protected by a photolytic protective group on a substrate;

exposing the organic material layer to light in a pattern to generate any one of the thiol group, the amino group, the hydroxyl group, the carboxyl group, and the sulfo group on an exposed area; and forming a pattern by arranging the metal atom-containing fine particles (A) on the exposed area.

The present invention also encompasses a method of producing a device.

The method of producing a device is characterized by using the method of forming a fine particle pattern according to the present invention.

Further features of the present invention will become apparent from the following description of exemplary embodiments with reference to the attached drawings.

BRIEF DESCRIPTION OF THE DRAWINGS

FIGS. 1A, 1B, 1C and 1D show process steps representing an embodiment of a method of forming a fine particle pattern according to the present invention.

FIGS. 4A, 4B, 4C and 4D each schematically show various fine particle patterns obtained by the method of forming a fine particle pattern according to the present invention.

DESCRIPTION OF THE EMBODIMENTS

Figure 2:
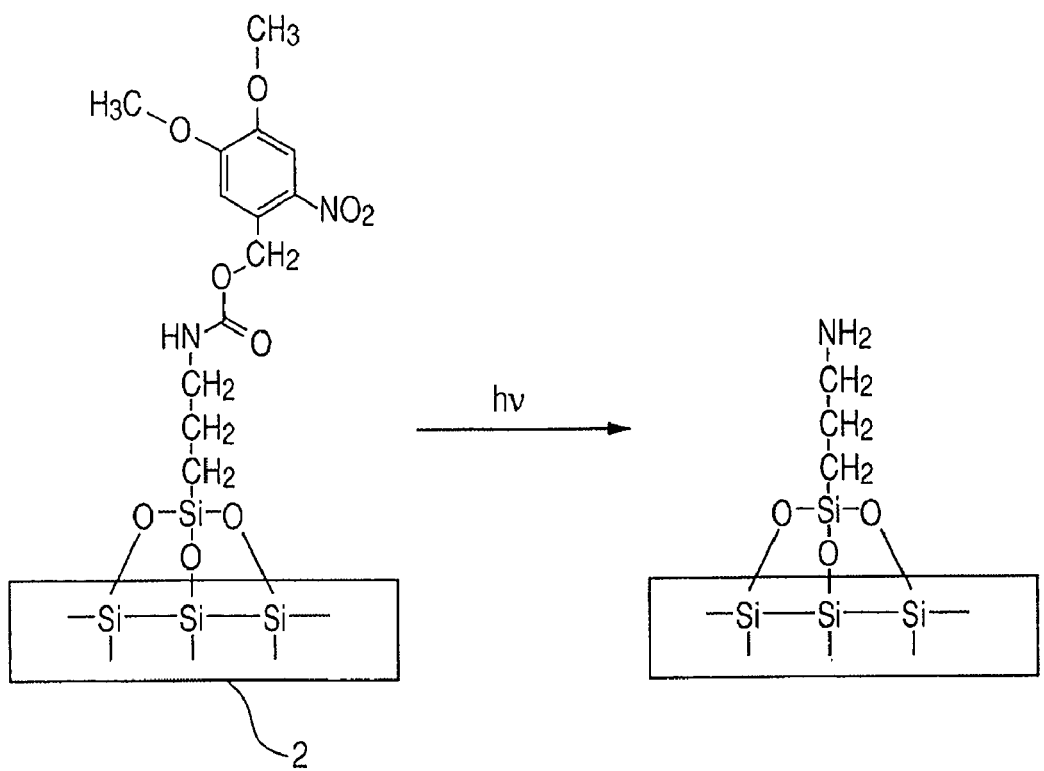
FIG. 2 shows a photochemical reaction of a silane coupling agent (B4).

Hereinafter, the present invention is described in detail.

According to the present invention, there is provided a method of forming a fine particle pattern having a structure wherein a plurality of metal atom-containing fine particles (A) are arranged on a substrate, comprising the steps of:

laminating an organic material layer on a substrate, the organic material layer being formed of an organic material having any one of a thiol group, an amino group, a hydroxyl group, a carboxyl group, and a sulfo group, each of which is protected by a photolytic protective group on a substrate;

exposing the organic material layer to light in a pattern to generate any one of the thiol group, the amino group, the hydroxyl group, the carboxyl group, and the sulfo group on an exposed area; and forming a pattern by arranging the metal atom-containing fine particles (A) on the exposed area.

The metal atom-containing fine particles (A) can be arranged in isolation from one another at intervals of 1 nm or more.

The metal atom-containing fine particles (A) may preferably be arranged using a colloidal solution of the metal atom-containing fine particles (A).

The organic material may preferably comprise a silane coupling agent (B) containing one of an alkoxysilyl group and a halogenated silyl group.

The silane coupling agent (B) may preferably comprise a silane coupling agent (B1) having a structure represented by the general formula (1):

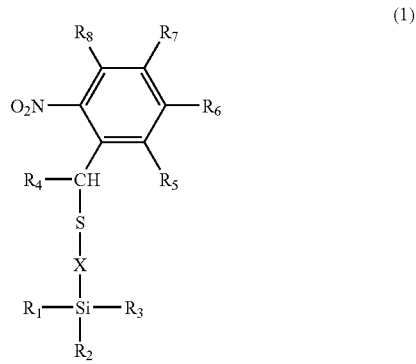

where, X represents any one of a methylene group, a phenylene group, a naphthylene group, and a divalent group having a structure in which a plurality of divalent groups of the methylene group, the phenylene group, and the naphthylene group are bound to each other, provided that part of hydrogen atoms of those groups may be substituted by one of a fluorine atom and an alkyl group;

$R_1$, $R_2$, and $R_3$ are each selected from the group consisting of an alkoxy group, a halogen atom, an alkyl group, and a hydrogen atom, provided that at least one of $R_1$, $R_2$, and $R_3$ represents one of an alkoxy group and a halogen atom;

$R_4$ represents one of a hydrogen atom and an alkyl group; and $R_5$, $R_6$, $R_7$, and $R_8$ are each selected from the group consisting of a nitro group, a hydrogen atom, a halogen atom, an alkyl group, an alkyl group part or the whole of hydrogen atoms of which is substituted by fluorine, and an alkoxy group part or the whole of hydrogen atoms of which is substituted by fluorine.

The silane coupling agent (B) can include a silane coupling agent (B2) having a structure represented by the general formula (2):

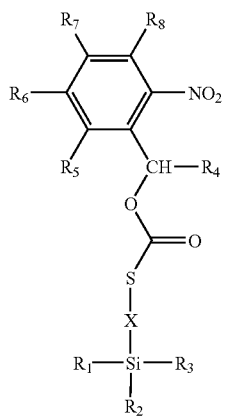

(2)

where, X and $R_1$ to $R_8$ have the same meanings as those of the general formula (1).

The silane coupling agent (B) can include a silane coupling agent (B3) having a structure represented by the general formula (3):

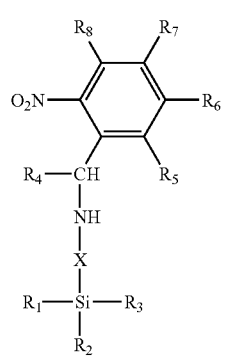

(3)

where, X and $R_1$ to $R_8$ have the same meanings as those of the general formula (1).

The silane coupling agent (B) can include a silane coupling agent (B4) having a structure represented by the general formula (4):

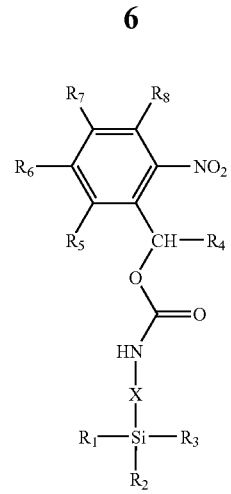

(4)

where, X and $R_1$ to $R_8$ have the same meanings as those of the general formula (1).

The silane coupling agent (B) can include a silane coupling agent (B5) having a structure represented by the general formula (5):

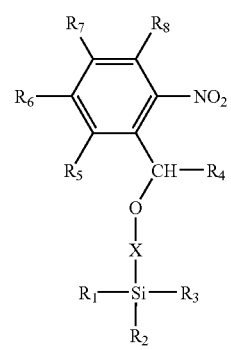

(5)

where, X and $R_1$ to $R_8$ have the same meanings as those of the general formula (1).

The silane coupling agent (B) can include a silane coupling agent (B6) having a structure represented by the general formula (6):

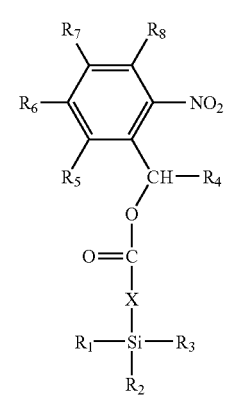

(6)

where, X and $R_1$ to $R_8$ have the same meanings as those of the general formula (1).

The silane coupling agent (B) can include a silane coupling agent (B7) having a structure represented by the general formula (7):

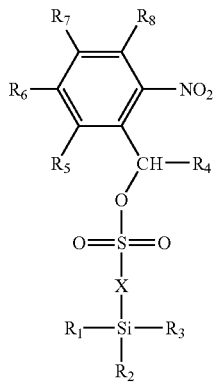
(7)

where, X and $R_1$ to $R_8$ have the same meanings as those of the general formula (1).

The silane coupling agent (B) can include a silane coupling agent (B8) having a structure represented by the general formula (8):

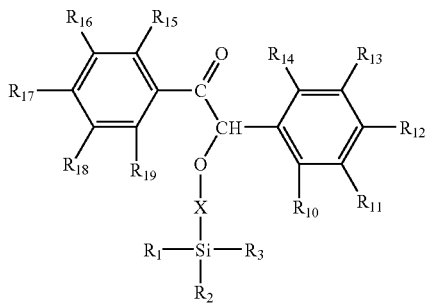
(8)

where, X and $R_1$ to $R_3$ have the same meanings as those of the general formula (1); and
R10 to R19 each represent any one of a hydrogen atom, a fluorine atom, an alkoxy group, and a thioalkoxy group.

The silane coupling agent (B) can include a silane coupling agent (B9) having a structure represented by the general formula (9):

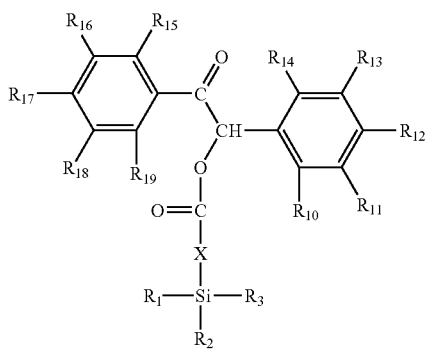
(9)

where, X and $R_1$ to $R_3$ have the same meanings as those of the general formula (1); and
$R_{10}$ to $R_{19}$ have the same meanings as those of the general formula (7).

The silane coupling agent (B) can include a silane coupling agent (B10) having a structure represented by the general formula (10):

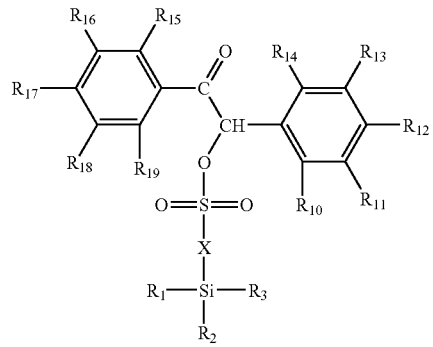
(10)

where, X and $R_1$ to $R_3$ have the same meanings as those of the general formula (1); and
$R_{10}$ to $R_{19}$ have the same meanings as those of the general formula (7).

The metal atom-containing fine particles (A) can each be a gold fine particle (A1). The metal atom-containing fine particles (A) can each be a gold nanorod (A2). The metal atom-containing fine particles (A) can each be a magnetic fine particle (A3). The metal atom-containing fine particles (A) can each be a fluorescent fine particle (A4).

In addition, there may be used the metal atom-containing fine particles (A) each having a surface which is modified to have a maleimido group on the surface terminal.

In addition, there may be used the metal atom-containing fine particles (A) each having a surface which is modified to have an amino group on the surface terminal.

In addition, there may be used the metal atom-containing fine particles (A) each having a surface which is modified to have a carboxyl group on the surface terminal.

In addition, there may be used the metal atom-containing fine particles (A) each having a surface which is modified to have a carboxylic acid anhydride on the surface terminal.

In addition, the exposing to light in a pattern may be performed by using near field light generated from an exposure mask provided with a light shielding layer having an opening narrower than a wavelength of light from a light source for exposure.

According to the present invention, there is provided a method of forming a fine particle pattern, which is excellent in pattern controllability, pattern accuracy, and productivity.

Further, according to the present invention, there can be provided a method of producing various devices. By the method, a device which requires a high density dot pattern can suitably be produced. Specific examples of the device include a single-electron device, a magnetic recording medium, a chemical sensor, a quantum dot laser. device, and a photonic crystal optical device.

EXAMPLES

Hereinafter, the present invention is described in further detail by-referring to examples.

In the present invention, the term "fine particle" is defined as a particle having an average particle diameter of 0.5 nm or more to 500 nm or less, and preferably 5 nm or more to 40 nm or less.

A silane coupling agent (B) in the present invention has a structure in which any one of functional groups such as a thiol group, an amino group, an hydroxyl group, a carboxyl group, and a sulfo group is protected by a photolytic protective group before exposure to light, and the photolytic protective group is removed therefrom by the exposure to light, whereby any one of the functional groups is generated. Examples of the photolytic protective groups for the thiol group, the amino group, the hydroxyl group, the carboxyl group, and the sulfo group include, for example, an o-nitrobenzyl ether, an o-nitrobenzyl ester, a benzoin ether, and a benzoin ester. In other words, the silane coupling agent (B) has any one of structures of the o-nitrobenzyl ether, the o-nitrobenzyl ester, the benzoin ether, and the benzoin ester in a silane coupling agent containing any one of the thiol group, the amino group, the hydroxyl group, the carboxyl group, and the sulfo group.

Figure 3:
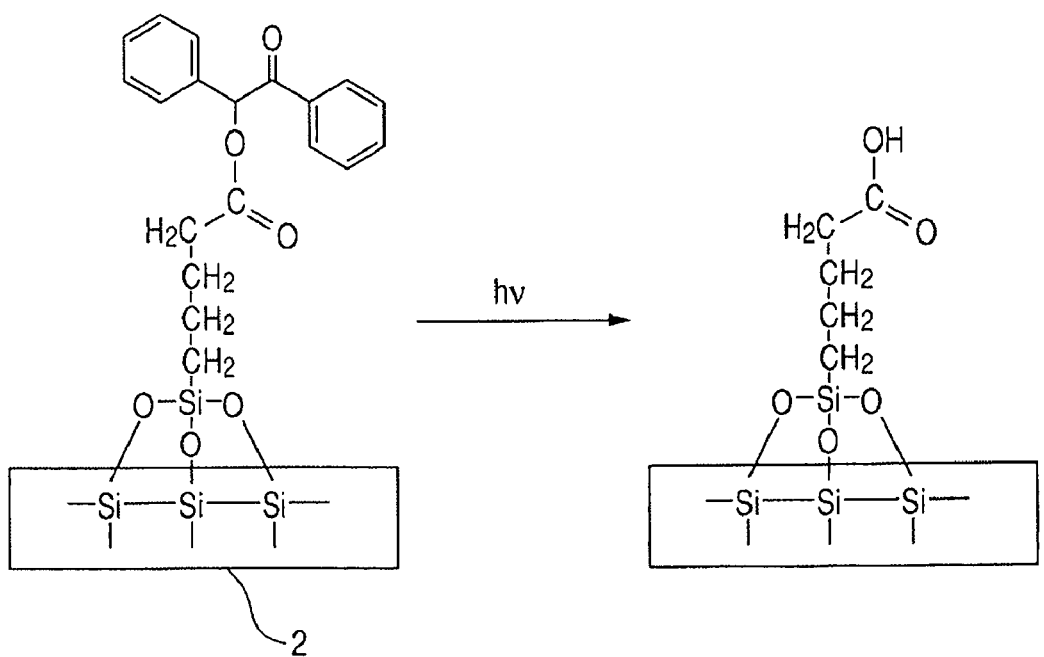
FIG. 3 shows a photochemical reaction of a silane coupling agent (B9).

The above-mentioned compounds are known to decompose by exposure to light to regenerate the functional groups as shown in FIGS. 2 and 3.

More specifically, silane coupling agents (B1) to (B10) represented by the general formulae (1) to (10), respectively, can be used in the present invention.

The silane coupling agents (B1) to (B10) can each be synthesized by one of known synthetic methods described in the following documents or by a combination of two or more of them.

The synthetic methods are described in:
Japanese Patent Application Laid-Open No. 2003-321479;
Japanese Patent Application Laid-Open No. 2002-80481;
Journal of Organic Chemistry, 67, 5567 (2002);
Journal of Organic Chemistry, 68, 9100 (2003); and
Journal of the American Chemical Society, 110, 301 (1988).

The silane coupling agent (B) can be immobilized on a substrate via a chemical bond. A wide variety of substrates can be used, and examples of the substrates include: a semiconductor substrate made of any one of Si, GaAs, InP, and the like; an insulating substrate made of any one of glass, quartz, BN, and the like; and any one of the semiconductor substrate and the insulating substrate on which one kind or multiple kinds of resists, metals, oxides, nitrides, and the like is/are formed into a film. It is particularly desirable that the substrate have a hydroxyl group generated on a surface thereof onto which the silane coupling agent (B) is immobilized.

The substrate is subjected to pretreatment as required to allow the surface of the substrate to have a hydroxyl group. The pretreatment involves exposing the surface of the substrate to one of an acidic solution and an ultraviolet-ozone atmosphere. Examples of the acidic solution include sulfuric acid, hydrochloric acid, nitric acid, and hydrogen peroxide, and one kind thereof may be used alone, or two or more of them may be used in combination. Sulfuric acid and hydrogen peroxide can be used in combination, which is particularly suitable for the pretreatment of an Si substrate. The pretreatment using an acidic solution is performed by any one of processes such as coating, spraying, and dipping.

FIGS. 1A to 1D show process steps of an embodiment of the method of forming a fine particle pattern of the present invention. The substrate 1 shown in FIG. 1A is coated with the silane coupling agent (B), and the whole is heated to form a silane coupling agent (B) layer 5 (FIG. 1B). The substrate can be coated with the silane coupling agent (B) by any one of an immersion method, spin coating, spray coating, vapor deposition, and the like using a liquid of the silane coupling agent (B) alone or a solution obtained by dissolving the silane coupling agent (B) in an organic solvent. In the present invention, the coating can be performed by immersion or spin coating. The silane coupling agent (B) can be appropriately heated after the coating to terminate a reaction between the silane coupling agent (B) and the hydroxyl group on the substrate. The heating may be performed at 80° C. to 200° C., and preferably 80° C. to 150° C. using a heating unit such as a hot plate or a hot-air dryer. By those treatments, a monomolecular layer of the silane coupling agent (B) is formed.

The silane coupling agent (B) layer thus formed as described above is generally exposed to light in a pattern by using a known light exposure apparatus to form an exposed area 4 (FIG. 1C). In a case where a silane coupling agent (B4) is used, for example, the exposure to light causes a photochemical reaction as shown in FIG. 2, whereby an amino group is generated selectively on the exposed area. In a case where a silane coupling agent (B9) is used, for example, the exposure to light causes a photochemical reaction as shown in FIG. 3, whereby a carboxyl group is generated selectively on the exposed area.

Any one of visible light, ultraviolet light, far ultraviolet light, X ray, an electron beam, γ ray, a molecular beam, an ion beam, and the like can be appropriately selected and used for a radiation ray for the exposure to light. It is particularly preferable to use any one of mercury lamp light (wavelengths: 436 nm, 365 nm, and 254 nm), KrF excimer laser light (wavelength: 248 nm), ArF excimer laser light (wavelength: 193 nm), and F2 excimer laser light (wavelength: 157 nm). In addition, it is preferable to use far ultraviolet light such as extreme ultraviolet light (EUV, wavelength: 13 nm) or an electron beam. These radiation rays may be used either alone or in combination.

For another method of exposure to light, there can be used near field light generated from a photomask provided with a light shielding layer having an opening narrower than a wavelength of light from a light source for exposure. The above-mentioned radiation rays can be used as a radiation ray for exposure to the near field light. These radiation rays may be used either alone or in combination. The exposure to the near field light is performed in such a manner that the light shielding layer of the photomask is brought into intimate contact with an article to be exposed.

To obtain a finer pattern, the exposure to light can be performed using the near field light which is not affected by the ArF excimer laser light, the F2 excimer laser light, the EUV, and the electron beam having short wavelengths, and by diffraction limit. An exposure apparatus to near field light is particularly preferably used in the present invention in terms of productivity since the apparatus does not require a precise optical system and an expensive light source, which make the apparatus inexpensive.

The exposure to light allows any one of the thiol group, the amino group, the hydroxyl group, the carboxyl group, and the sulfo group, immobilized on the substrate, to be generated in a pattern on an exposed area of the substrate. The photochemical reaction of the silane coupling agent (B) of the present invention is irreversible, so a chemically-active group in the exposed area does not lose its activity as described in Japanese Patent Application Laid-Open No. 2003-168606. In addition, the generated thiol group, amino group, hydroxyl group, carboxyl group, and sulfo group have high chemical activities, so they rapidly and strongly bind to metal atom-containing fine particles (A). In addition, the chemically-active groups in an unexposed area are each protected by a photolytic protective group via a covalent bond, so the chemically-active groups do not bind to the metal atom-containing fine particles (A). Thus, by using the method of forming a fine particle pattern according to the present invention, there can be formed a fine particle pattern which has high contrast between an exposed area and an unexposed area. Note that since by-products are generated on the exposed area, the substrate after completion of the exposure to light is immersed in an organic solvent to remove the by-products as necessary.

The substrate after completion of the exposure to light is immersed in a colloidal solution in which the metal atom-containing fine particles (A) are dispersed. By the step, the metal atom-containing fine particles (A) 3 are selectively adhered onto the exposed area 4 (FIG. 1D).

The kinds of the metal atom-containing fine particles (A) are selected depending on a device of interest. In a case of preparing a single-electron device, an electroconductive fine particle such as a fine particle of a metal, a metal oxide, or the like is used. In a case of preparing a magnetic recording medium such as a patterned medium, a magnetic fine particle (A3) is used, or a fine particle of a ferromagnetic metal is adhered onto a substrate and then is subjected to magnetization. Examples of the ferromagnetic metal include Co, Ni, Fe, FePt, CoPt, CoNi, CoCr, CoP, CoNiP, FeCoB, FeCoNi, CoNiFeB, FeNi, FeCo, and CoNiPt. In a case of preparing a chemical sensor, a metal fine particle is used. A noble metal fine particle is preferably used in terms of sensitivity and chemical stability, with a gold fine particle (A1) and a gold nanorod (A2) being particularly preferable. In a case of preparing a quantum dot laser device, a semiconductor fine particle such as GaAs, InGaAs, GaN, InP, or InAs is used.

In a case of preparing a photonic crystal optical device, a fine particle of glass, an inorganic crystal, a semiconductor, an organic polymer, a metal, or the like is used.

FIGS. 4A to AD each schematically show various fine particle patterns obtained by the method of forming a fine particle pattern according to the present invention. Depending on the device of interest, the patterns as described below can be freely created:

an isolated dot pattern in which one of fine particles 3 is adhered onto one of fine dot-like exposed areas 4 on the substrate 1 (FIG. 4A);

an isolated line pattern in which fine particles 3 are aligned in one line on a narrow line-like exposed pattern 4 (FIG. 4B);

a closest packed pattern in which fine particles 3 are arranged in a closest arrangement with one another on an exposed area 4 having a size larger than that of the fine particles (FIG. 4C); and a random pattern in which fine particles 3 are arranged at random at certain intervals caused by repulsive force among the fine particles on an exposed area 4 having a larger size than that of the fine particles (FIG. 4D). However, the patterns to be created are not limited to those.

Hereinafter, specific combinations of a silane coupling agent (B) and a metal atom-containing fine particle (A) are described.

Figure 5:
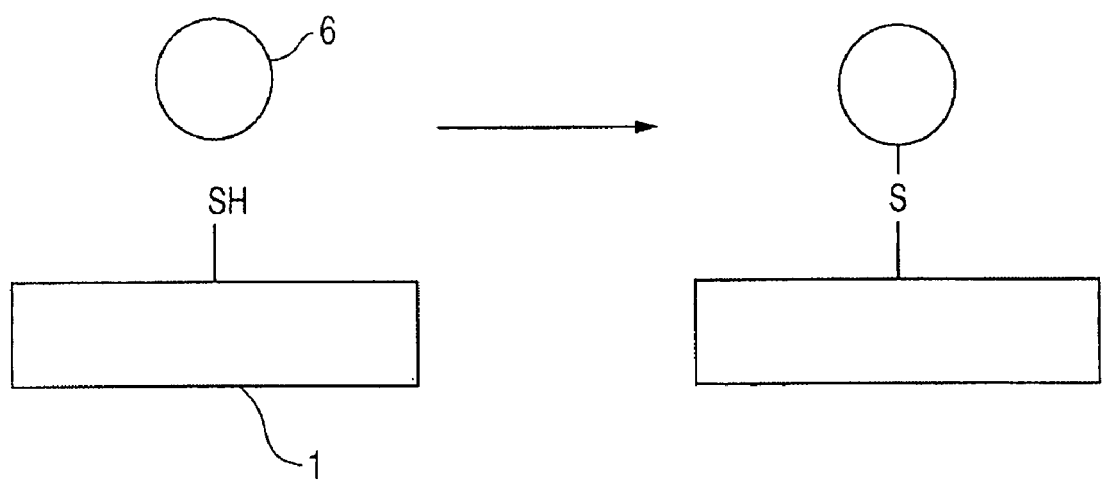
FIG. 5 shows a bond between a thiol group on an exposed area of a substrate and one of a gold fine particle and a gold nanorod.
Figure 6:
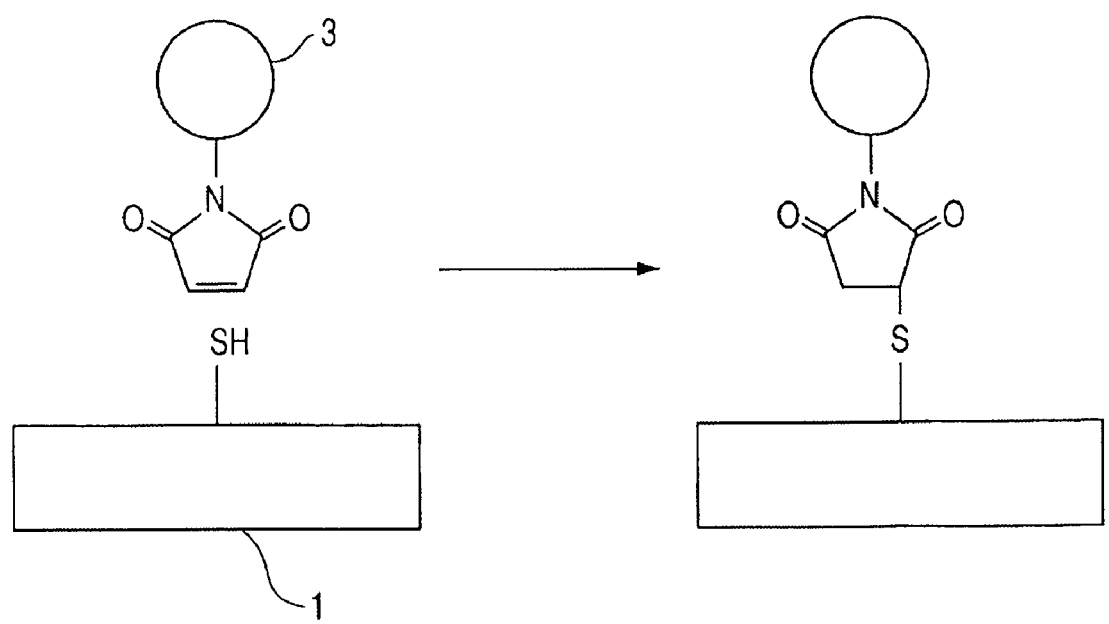
FIG. 6 shows a bond between the thiol group on an exposed area of a substrate and a maleimido group on a surface terminal of a fine particle.

FIGS. 5 and 6 each show cases of using compounds each of which generates thiol by exposure to light, such as a silane coupling agent (B1) and a silane coupling agent (B2). Reference numeral 1 denotes a substrate, 6 a gold fine particle or gold nanorod, and 3 a metal atom-containing fine particle. As shown in FIGS. 5 and 6, there can be preferably used, as the metal atom-containing fine particle (A), a gold fine particle (A1), a gold nanorod (A2), and a fine particle having a maleimido group on the terminal. It is known that a gold atom and a thiol group, and a maleimido group and a thiol group easily react with each other, respectively, to form strong covalent bonds.

Figure 7:
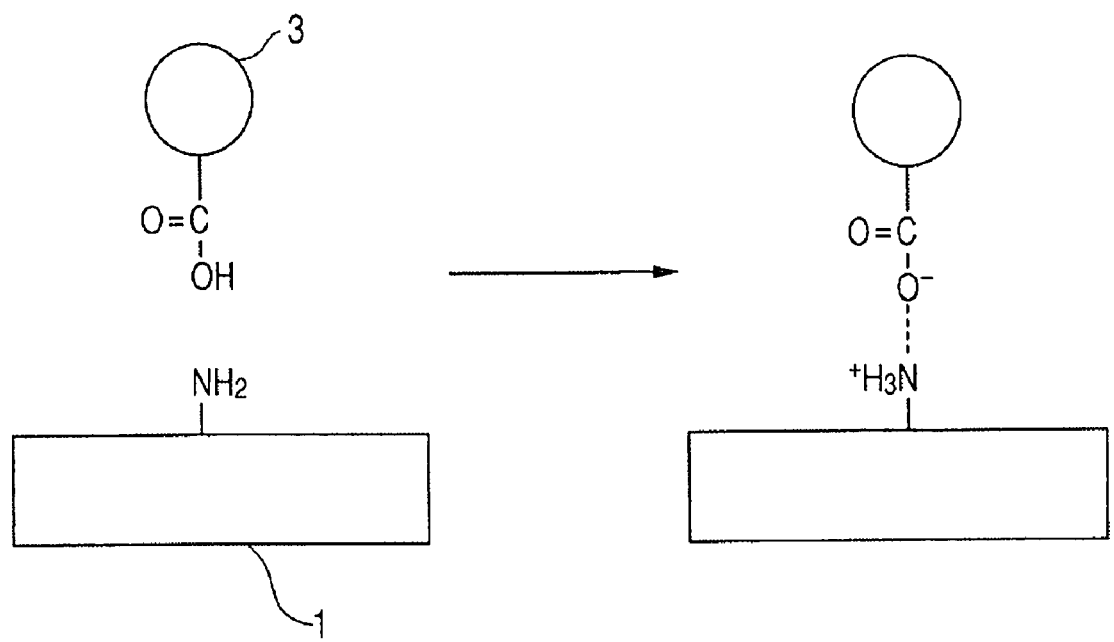
FIG. 7 shows a bond between an amino group on an exposed area of a substrate and a carboxyl group on a surface terminal of a fine particle.
Figure 8:
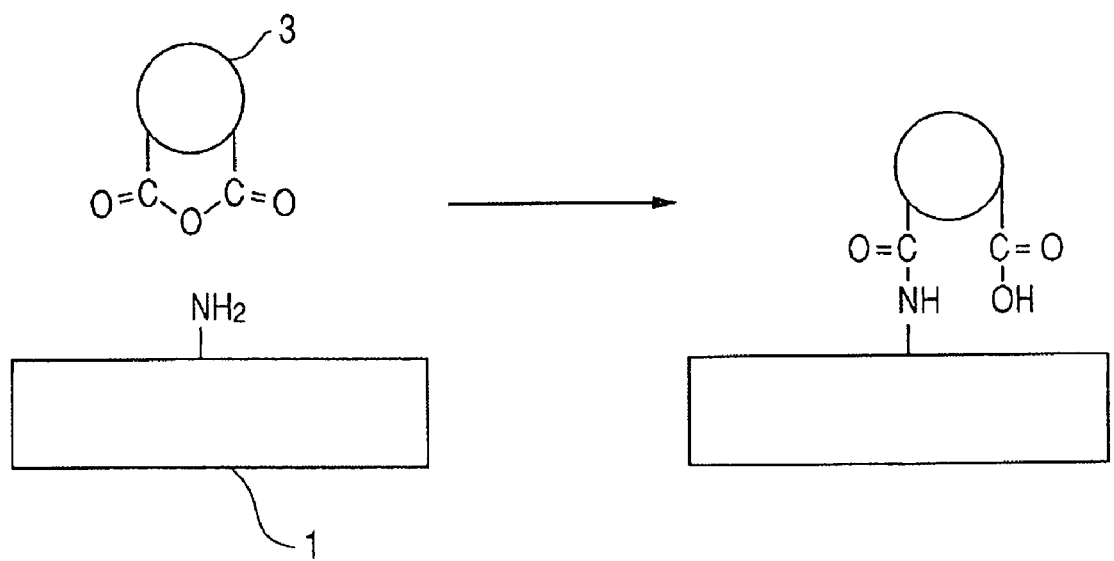
FIG. 8 shows a bond between the amino group on an exposed area of a substrate and a carboxylic acid anhydride on a surface terminal of a fine particle.

FIGS. 7 and 8 show cases of using compounds each of which generates an amino group by exposure to light, such as a silane coupling agent (B3) and a silane coupling agent (B4). Reference numeral 1 denotes a substrate, and 3 a metal atom-containing fine particle. As shown in FIGS. 7 and 8, there can be preferably used, as the metal atom-containing fine particle (A), a gold fine particle (A1), a gold nanorod (A2), and a fine particle having a carboxyl group or a carboxylic acid anhydride on the terminal. The gold fine particle (A1) and the gold nanorod (A2) are negatively charged and each forms an electrostatic bond with an amino group which is positively charged. The carboxyl group and the amino group bind to each other via an ionic bond. The carboxylic acid anhydride and the amino group easily react with each other at room temperature to form an amide bond, leading to a strong bond.

Figure 9:
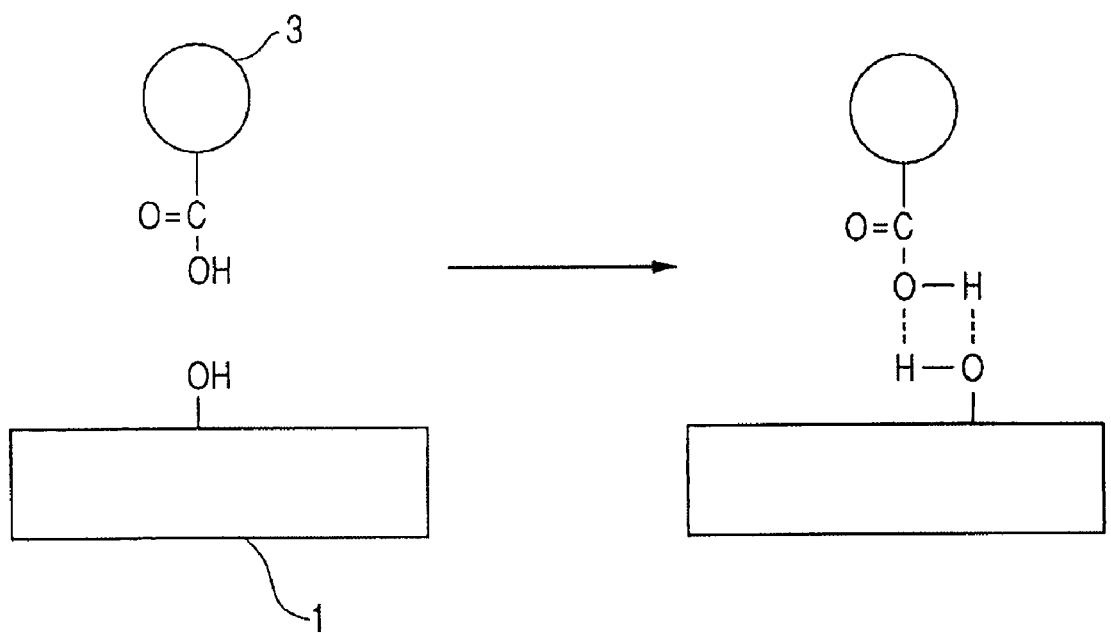
FIG. 9 shows a bond between a hydroxyl group on an exposed area of a substrate and a carboxyl group on a surface terminal of a fine particle.
Figure 10:
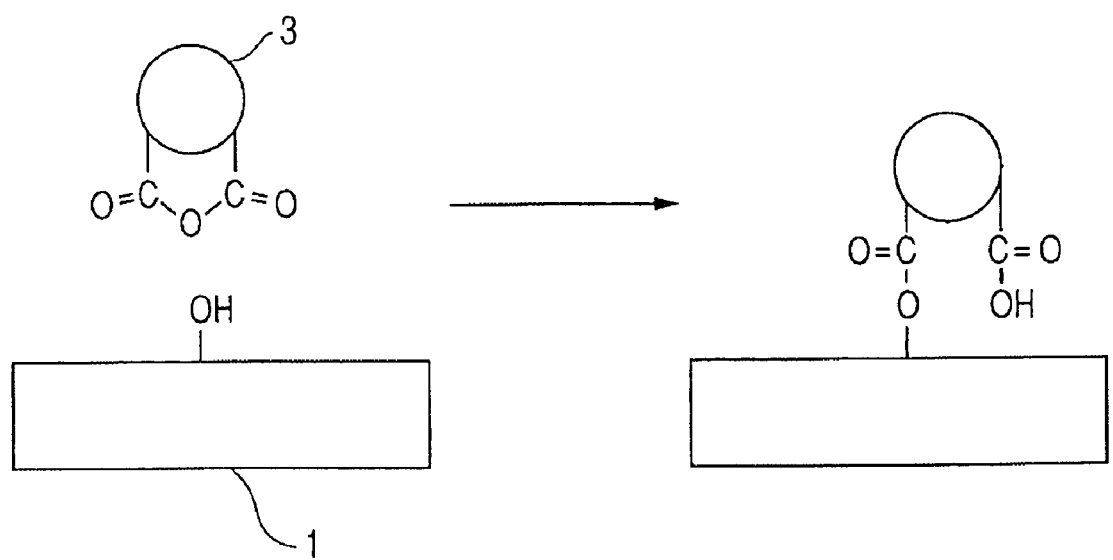
FIG. 10 shows a bond between the hydroxyl group on an exposed area of a substrate and a carboxylic acid anhydride on a surface terminal of a fine particle.

FIGS. 9 and 10 show cases of using compounds each of which generates a hydroxyl group by exposure to light, such as a silane coupling agent (B5) and a silane coupling agent (B8). Reference numeral 1 denotes a substrate, and 3 a metal atom-containing fine particle. As shown in FIGS. 9 and 10, there can be preferably used, as the metal atom-containing fine particle (A), a fine particle having a carboxyl group or a carboxylic acid anhydride on the terminal. The carboxyl group and the hydroxyl group bind to each other via a hydrogen bond. The carboxylic acid anhydride and the hydroxyl group easily react with each other at room temperature to form an ester bond, leading to a strong bond.

Figure 11:
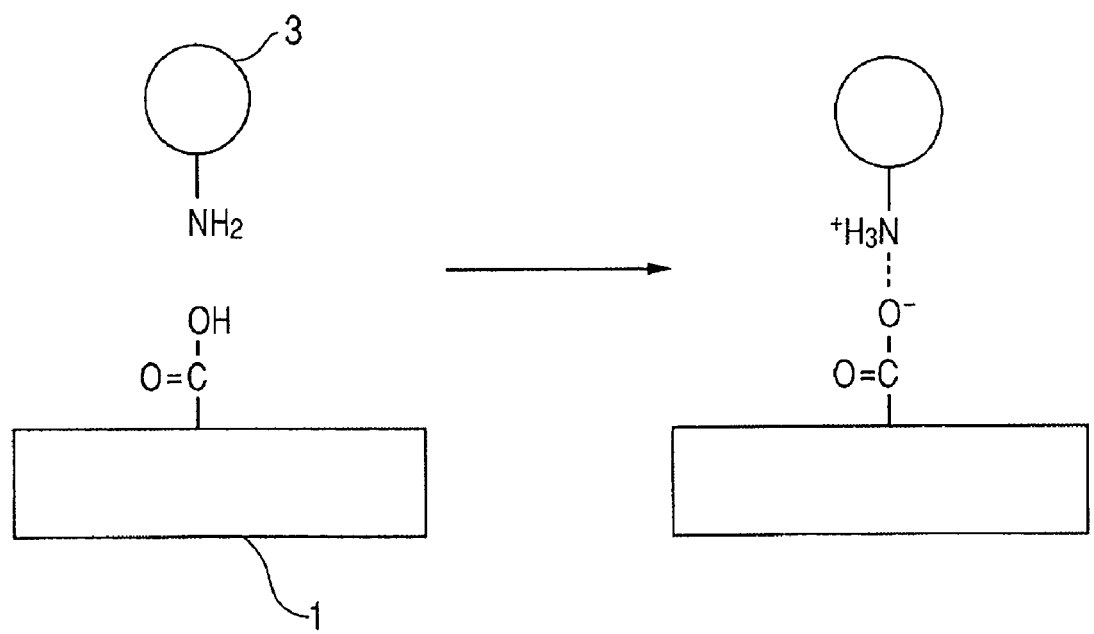
FIG. 11 shows a bond between a carboxyl group on an exposed area of a substrate and an amino group on a surface terminal of a fine particle.

FIG. 11 shows a case of using a compound which generates a carboxyl group by exposure to light, such as a silane coupling agent (B6) or a silane coupling agent (B9). Reference numeral 1 denotes a substrate, and 3 a metal atom-containing fine particle. As shown in FIG. 11, there can be used, as the metal atom-containing fine particle (A), a fine particle having an amino group on the terminal. The amino group and the carboxyl group bind to each other via an ionic bond.

Figure 12:
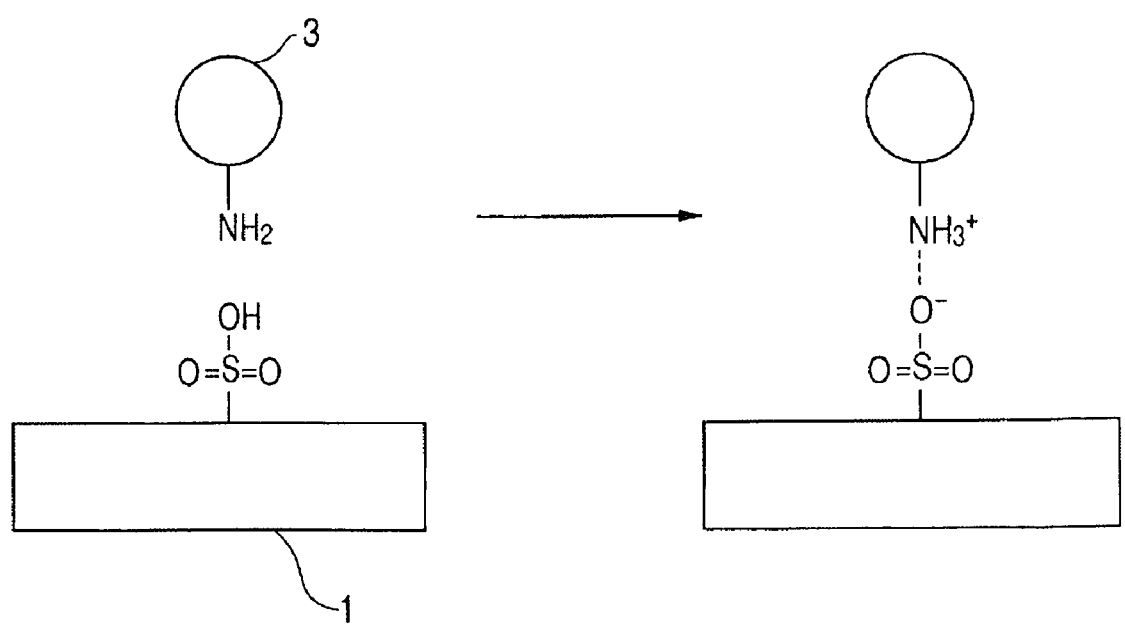
FIG. 12 shows a bond between a sulfo group on an exposed area of a substrate and an amino group on a surface terminal of a fine particle.

FIG. 12 shows a case of using a compound which generates a sulfo group by exposure to light, such as a silane coupling agent (B10). Reference numeral 1 denotes a substrate, and 3 a metal atom-containing fine particle. As shown in FIG. 12, there can be used, as the metal atom-containing fine particle (A), a fine particle having an amino group on the terminal. The amino group and the sulfo group bind to each other via an ionic bond.

The metal atom-containing fine particles (A) can be rearranged by an appropriate treatment after the metal atom-containing fine particles (A) are selectively adhered onto the exposed area of a substrate. Examples of the treatment for rearrangement are shown below.

A phenomenon as described below occurs when multiple gold fine particles (A1) are adhered onto the exposed area by using a compound which generates an amino group by exposure to light, such as the silane coupling agent (B3) or a silane coupling agent (B4). That is, since the gold fine particles are charged, they repel one another so that they exist apart from one another in a distance defined by the quantity of electric charge held by colloids. To rearrange the gold fine particles in the above-mentioned pattern into a closest packed pattern, there can be used a method described in Chemical Communication, 1007 (1997).

When the above-mentioned substrate is immersed in a thiol solution, weak electrostatic bonds between the amino groups and the gold fine particles on the substrate are substituted by bonds between the gold fine particles and the thiol groups because a thiol group is apt to bind to a gold atom, leading to coating of surfaces of the gold fine particles with the thiol molecules. The thiol-coated gold fine particles can be dispersed over the substrate, and bind to one another by the Van der Waals' force, whereby the gold fine particles are rearranged in a closest manner.

Incidentally, the method of rearranging gold fine particles as described above has a problem in that the gold fine particles are apt to be liberated. Therefore, it is preferable to apply voltage to the substrate when the substrate is immersed in the thiol solution as described in Japanese Patent Application Laid-Open No. 2001-168317.

The method of arranging gold fine particles in a closest manner as described above is suitable for preparation of a single-electron device in which distances between the metal fine particles are expected to be several nanometers or less.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-064666, filed Mar. 9, 2006 which is hereby incorporated by reference herein in its entirety.

What is claimed is:

1. A method of forming a fine particle pattern having a structure wherein a plurality of metal atom-containing fine particles (A) are arranged on a substrate, comprising the steps of:
laminating an organic material layer on a substrate, the organic material layer being formed of an organic material having any one of a thiol group, an amino group, a hydroxyl group, a carboxyl group, and a sulfo group, each of which is protected by a photolytic protective group;
exposing the organic material layer to light in a pattern to generate any one of the thiol group, the amino group, the hydroxyl group, the carboxyl group, and the sulfo group on an exposed area; and
forming a pattern by arranging the metal atom-containing fine particles (A) on the exposed area,
wherein the organic material comprises a silane coupling agent (B) containing one of an alkoxysilyl group and a halogenated silyl group, and
the metal atom-containing fine particles (A) are arranged in isolation from one another at intervals of 1 nm or more.

2. A method of forming a fine particle pattern according to claim 1, wherein the metal atom-containing fine particles (A) are arranged by using a colloidal solution of the metal atom-containing fine particles (A).

3. A method of forming a fine particle pattern according to claim 1, wherein the silane coupling agent (B) comprises a silane coupling agent (B1) having a structure represented by the general formula (1):

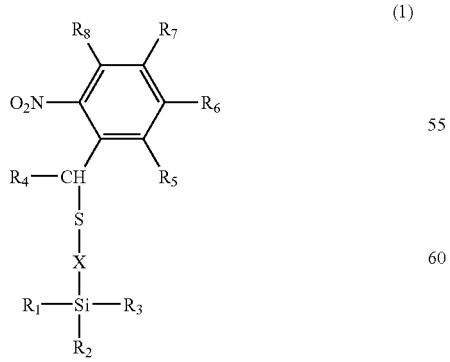

(1)

wherein, X represents any one of a methylene group, a phenylene group, a naphthylene group, and a divalent group having a structure in which a plurality of divalent groups of the methylene group, the phenylene group, and the naphthylene group are bound to each other, provided that part of hydrogen atoms of those groups may be substituted by one of a fluorine atom and an alkyl group;

$R_1$, $R_2$, and $R_3$ are each selected from the group consisting of an alkoxy group, a halogen atom, an alkyl group, and a hydrogen atom, provided that at least one of $R_1$, $R_2$, and $R_3$ represents one of an alkoxy group and a halogen atom;

$R_4$ represents one of a hydrogen atom and an alkyl group; and $R_5$, $R_6$, $R_7$, and $R_8$ are each selected from the group consisting of a nitro group, a hydrogen atom, a halogen atom, an alkyl group, an alkyl group part or the whole of hydrogen atoms of which is substituted by fluorine, and an alkoxy group part or the whole of hydrogen atoms of which is substituted by fluorine.

4. A method of forming a fine particle pattern according to claim 1, wherein the silane coupling agent (B) comprises a silane coupling agent (B2) having a structure represented by the general formula (2):

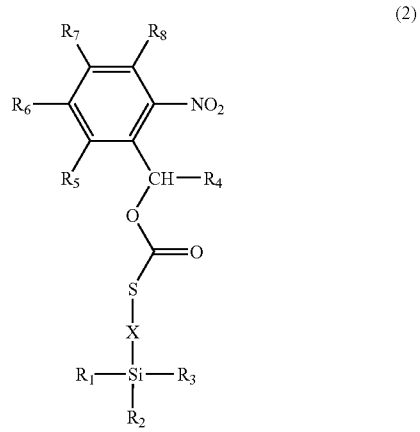

(2)

wherein, X and $R_1$ to $R_8$ have the same meanings as those of the general formula (1).

5. A method of forming a fine particle pattern according to claim 1, wherein the silane coupling agent (B) comprises a silane coupling agent (B3) having a structure represented by the general formula (3):

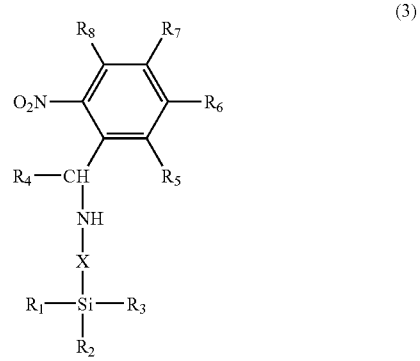

(3)

wherein, X and $R_1$ to $R_8$ have the same meanings as those of the general formula (1).

6. A method of forming a fine particle pattern according to claim 1, wherein the silane coupling agent (B) comprises a silane coupling agent (B4) having a structure represented by the general formula (4):

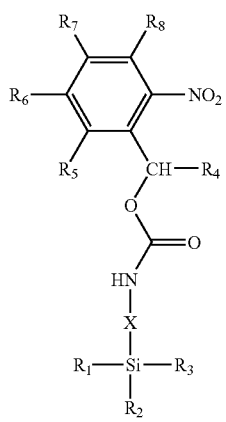

(4)

wherein, X and $R_1$ to $R_8$ have the same meanings as those of the general formula (1).

7. A method of forming a fine particle pattern according to claim 1, wherein the silane coupling agent (B) comprises a silane coupling agent (B5) having a structure represented by the general formula (5):

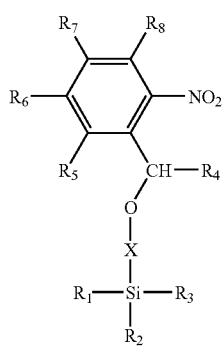

(5)

wherein, X and $R_1$ to $R_8$ have the same meanings as those of the general formula (1).

8. A method of forming a fine particle pattern according to claim 1, wherein the silane coupling agent (B) comprises a silane coupling agent (B6) having a structure represented by the general formula (6):

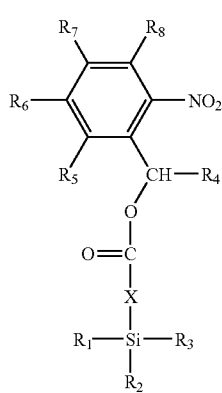

(6)

wherein, X and $R_1$ to $R_8$ have the same meanings as those of the general formula (1).

9. A method of forming a fine particle pattern according to claim 1, wherein the silane coupling agent (B) comprises a silane coupling agent (B7) having a structure represented by the general formula (7):

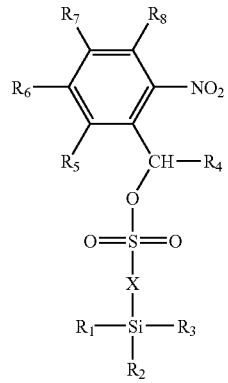

(7)

wherein, X and $R_1$ to $R_8$ have the same meanings as those of the general formula (1).

10. A method of forming a fine particle pattern according to claim 1, wherein the silane coupling agent (B) comprises a silane coupling agent (B8) having a structure represented by the general formula (8):

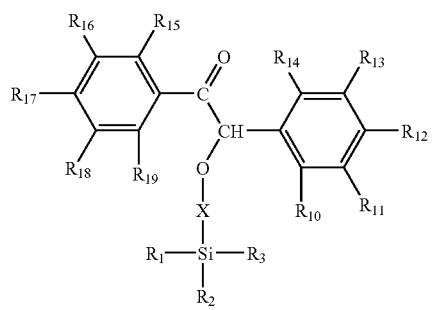

(8)

wherein, X and $R_1$ to $R_3$ have the same meanings as those of the general formula (1); and $R_{10}$ to $R_{19}$ each represent any one of a hydrogen atom, a fluorine atom, an alkoxy group, and a thioalkoxy group.

11. A method of forming a fine particle pattern according to claim 1, wherein the silane coupling agent (B) comprises a silane coupling agent (B9) having a structure represented by the general formula (9):

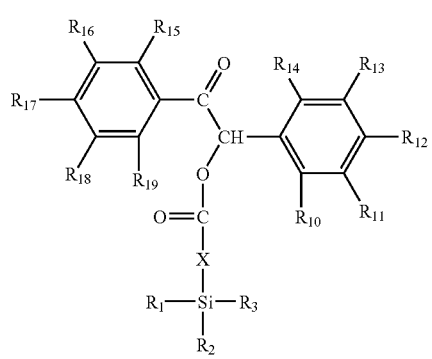

(9)

wherein, X and $R_1$ to $R_3$ have the same meanings as those of the general formula (1); and $R_{10}$ to $R_{19}$ have the same meanings as those of the general formula (7).

12. A method of forming a fine particle pattern according to claim 1, wherein the silane coupling agent (B) comprises a silane coupling agent (B10) having a structure represented by the general formula (10):

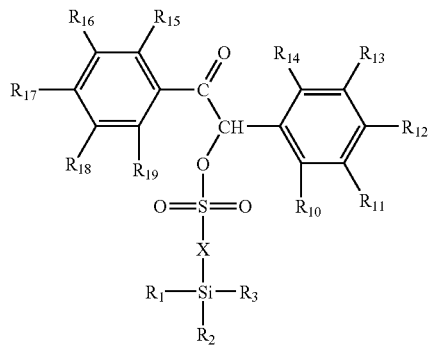

(10)

wherein, X and $R_1$ to $R_3$ have the same meanings as those of the general formula (1); and $R_{10}$ to $R_{19}$ have the same meanings as those of the general formula (7).

13. A method of forming a fine particle pattern according to claim 1, wherein the metal atom-containing fine particles (A) each have a surface which is modified to have a maleimido group on the surface terminal.

14. A method of forming a fine particle pattern according to claim 1, wherein the metal atom-containing fine particles (A) each have a surface which is modified to have an amino group on the surface terminal.

15. A method of forming a fine particle pattern according to claim 1, wherein the metal atom-containing fine particles (A) each have a surface which is modified to have a carboxyl group on the surface terminal.

16. A method of forming a fine particle pattern according to claim 1, wherein the metal atom-containing fine particles (A) each have a surface which is modified to have a carboxylic acid anhydride on the surface terminal.

17. A method of forming a fine particle pattern according to claim 1, wherein the exposing to light in a pattern is performed by using near field light generated from an exposure mask provided with a light shielding layer having an opening narrower than a wavelength of light from a light source for exposure.

18. A method of producing a device, comprising using the method of forming a fine particle pattern according to claim 1.

* * * * *